United States Patent [19]
Huang et al.

[11] Patent Number: 5,684,417
[45] Date of Patent: Nov. 4, 1997

[54] DATA SENSING APPARATUS OF A READ ONLY MEMORY DEVICE

[75] Inventors: Heng-Sheng Huang, Taipei; Kun-Luh Chen, Hsinchu, both of Taiwan

[73] Assignee: United Microelectronics Corporation, Taipei, Taiwan

[21] Appl. No.: 555,715

[22] Filed: Nov. 14, 1995

[51] Int. Cl.$^6$ .................................................. G01R 19/00
[52] U.S. Cl. ............................ 327/51; 327/80; 327/143; 327/85
[58] Field of Search ............................ 327/538, 540, 327/545, 546, 51, 77, 78, 80, 81, 85, 143

[56] References Cited

U.S. PATENT DOCUMENTS

| | | | |
|---|---|---|---|
| 4,916,334 | 4/1990 | Minagawa et al. | 327/546 |
| 5,352,859 | 10/1994 | Kaneko et al. | 219/69.13 |
| 5,440,263 | 8/1995 | Fournel et al. | 327/546 |
| 5,442,304 | 8/1995 | Wong et al. | 327/546 |
| 5,446,402 | 8/1995 | Yoshimori | 327/546 |

*Primary Examiner*—Timothy P. Callahan
*Assistant Examiner*—Jung Ho Kim
*Attorney, Agent, or Firm*—Cushman Darby & Cushman IP Group of Pillsbury Madison & Sutro, LLP

[57] ABSTRACT

A data sensing apparatus particularly useful for sensing a ROM device. The apparatus can be used with various voltage level devices because it has an adjustable load. A first load element is connected to the voltage source applied to the ROM device. A second load element is connected in parallel with the first load element. A switching element is connected to the first load element and provides a path for a sensing current of the ROM device. An inverter, responsive to the sensing current, controls the switching element. An amplifier, connected to the switching element, provides a useful output indicative of the sensing current of the ROM device. A voltage level detector detects the voltage level of the voltage source. It disables the second load element so as to increase the load when the voltage level of the voltage source is higher than a predetermined value.

22 Claims, 4 Drawing Sheets

DATA SENSING APPARATUS OF A READ ONLY MEMORY DEVICE

BACKGROUND OF THE INVENTION

1. Field of the Invention

The present invention relates to semiconductor memory devices, and more specifically, to a data sensing apparatus of a read-only-memory (ROM) device.

2. Description of Related Art

Non-volatile memory devices, such as ROM devices, are utilized in systems requiring memory having high density and high stability. The memory cells of a ROM comprise transistors whose channel currents are determined by the threshold voltage of the transistor channels. Most ROM devices have quite low data-sensing currents because of their high threshold voltages. Therefore, it is important to have a sensitive data sensing apparatus which can indicate minor variations in sensing current.

FIG. 1 (Prior Art) is a schematic diagram of a conventional data sensing apparatus. The circuit includes a load element MP0, a switching element MN0 and an inverter G0. Switching element MN0 connects to memory cells 6 of the ROM device to measure sensing current. The memory cells are also connected to an input of a NOR gate G0. NOR gate G0 controls the on/off state of switching element MN0 based on the sensing current which determines the signal at one of the inputs of gate G0. In turn, the on/off state of switching element MN0 controls the voltage level at a point A which is biased by a voltage source $V_{DD}$ through load element MP0. When switching element MN0 is on, current flows through it and the voltage level at point A is pulled down. However, when switching element MN0 is off (open), current does not flow through it and the voltage level at point A is pulled up by voltage source $V_{DD}$. To provide a useful signal output, one or more amplifiers/inverters are connected to point A. The output of the last amplifier provides a useful signal indicative of the sensed current.

Because load element MP0 is a PMOS transistor, the channel width of the transistor is predetermined and lacks the flexibility to maintain a bias current at point A. This can be a problem when the voltage level of voltage source $V_{DD}$ is not constant. For example, when voltage source $V_{DD}$ provides a high-level voltage and switching element MN0 is on, the voltage level at point A may be too high if the channel width of transistor MP0 is wide. Or, when the voltage level of voltage source $V_{DD}$ becomes low and switching element MN0 is off, a too narrow channel width of load element MP0 will cause insufficient bias current at point A. These two cases will both affect data sensing-precision. Since ROM devices have to meet the requirements of many kinds of industrial electronic products, such as personal computers and notebook computers which provide various source voltage levels, maintaining the data-sensing sensitivity of the ROM devices has become increasingly important.

SUMMARY OF THE INVENTION

Accordingly, the present invention provides a data sensing apparatus with various active load elements corresponding to the voltage level of the voltage source applied to the ROM device, thus improving the data sensing precision.

The present invention also provides a data sensing apparatus of a ROM device that has a data sensing speed that is greater than that of known devices.

The data sensing apparatus of the present invention comprises: a first load element connected to the voltage source applied to the ROM device; a second load element parallel connected to the first load element; a switching element connecting to the first load element and providing a path for a sensing current of the ROM device; an inverter for controlling the switching element by the sensing current; an amplifier connecting the switching element to output an amplified indication of the sensing current of the ROM device; and a voltage level detector for detecting the voltage level of the voltage source; the voltage level detector disabling the second load element when the voltage level of the voltage source is higher than a predetermined value. Since only the first load element is active when the voltage level of the voltage source is relatively high, the effectively high resistance provided by the first load element will somewhat reduce the high voltage level of the voltage source. When the voltage level of the voltage source is low, both the first load element and the second load element are active, and the effectively low resistance will facilitate the pull-up operation.

BRIEF DESCRIPTION OF THE DRAWINGS

The above features of the present invention will become more apparent by reference to the following descriptions in connection with accompanying drawings, wherein.

DETAILED DESCRIPTION OF PREFERRED EMBODIMENTS

Figure 1:
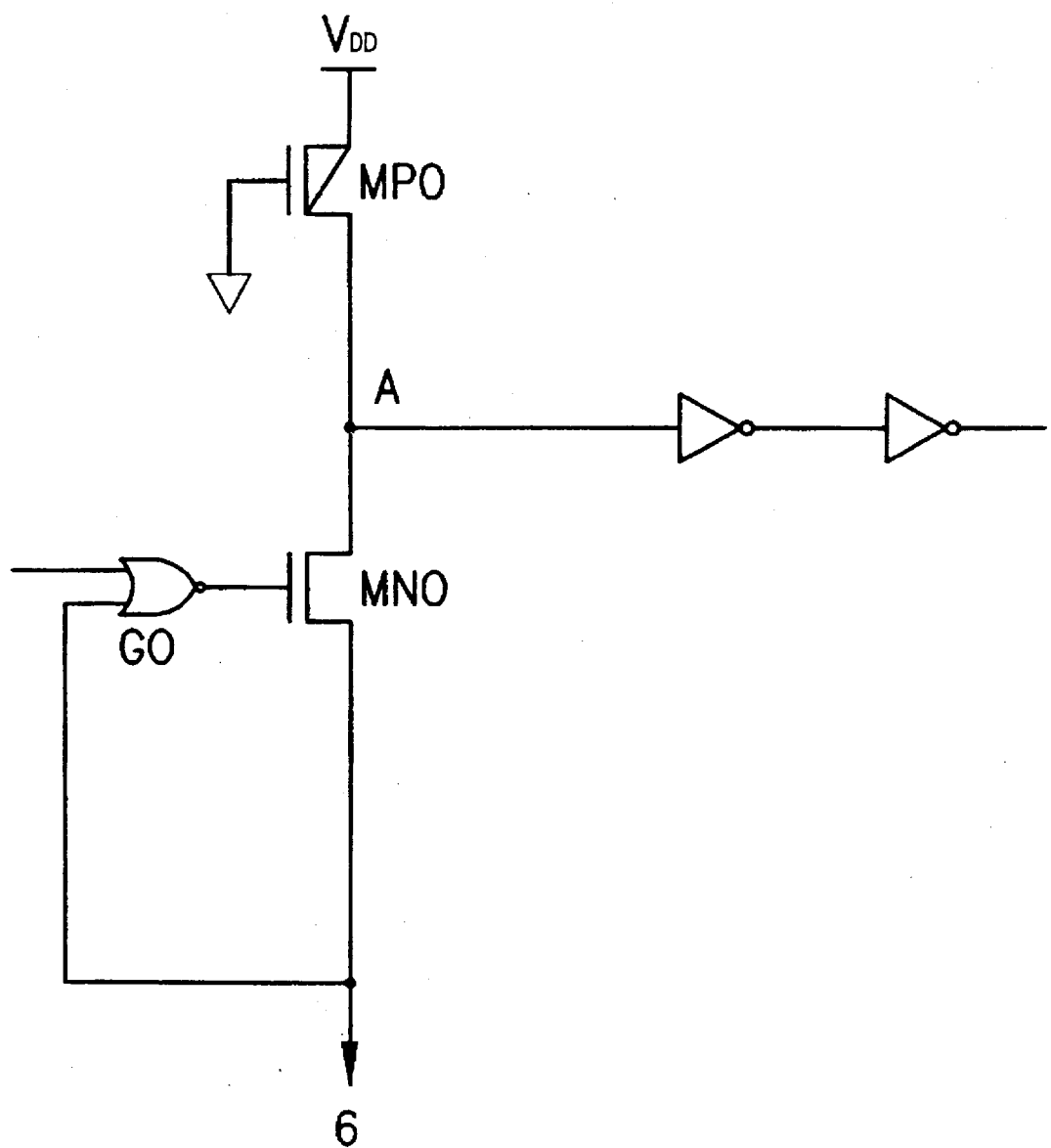
FIG. 1 (Prior Art) is a schematic diagram of a known data sensing circuit.
Figure 2:
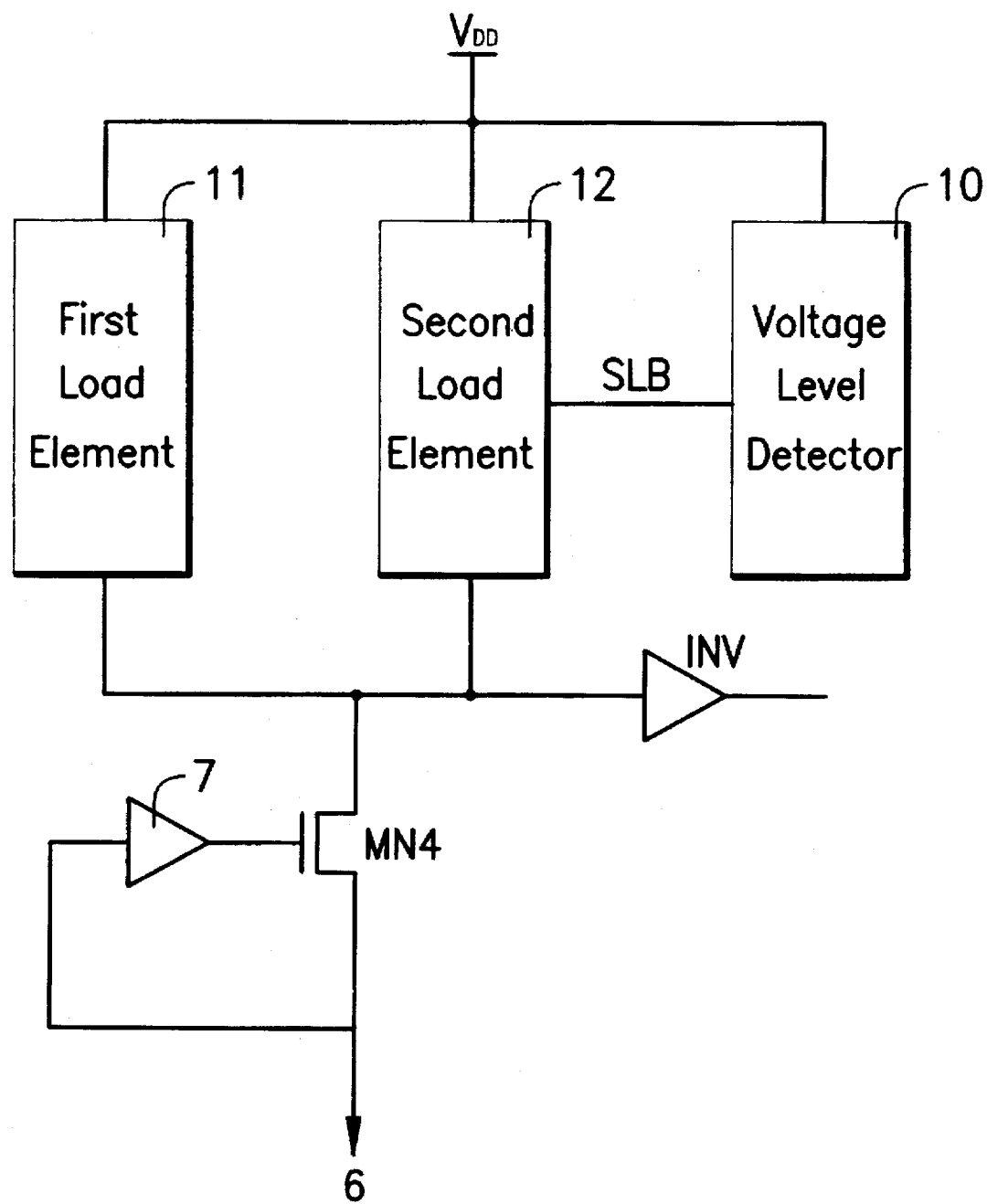
FIG. 2 is a block/schematic diagram of a circuit according to the present invention.

FIG. 2 is a block/schematic diagram of a circuit according to the present invention. The circuit arrangement provides various effective load resistances to cope with different voltage levels of voltage source $V_{DD}$. A first load element 11 is connected to voltage source $V_{DD}$. A second load element 12 is connected in parallel with first load element 11. A switching element MN4 is connected to the other ends, respectively of first load element 11 and second load element 12. It provides a path for a sensing current from memory cells 6 of the ROM device. An inverter 7 controls switching element MN4 based on the sensing current. An amplifier INV has its input connected to the node which couples first load element 11, second load element 12 and switching element MN4. Amplifier INV outputs an amplified indication of the sensing current from memory cells 6 (indicated only by the reference numeral). Voltage level detector 10 detects the voltage level of voltage source $V_{DD}$ and provides a signal SLB indicative of a comparison of voltage source $V_{DD}$ with a predetermined voltage.

Output signal SLB from voltage level detector 10 can disable second load element 12. This would occur when the voltage level of voltage source $V_{DD}$ is lower than a predetermined value. When second load element 12 is disabled, it acts as an open circuit and therefore only first load element 11 is active and a higher effective load resistance is provided for the ROM device. When the voltage level of the voltage source is higher than the predetermined value, SLB causes second load element 12 to be active. Then first load element 11 and second load element 12 are connected in parallel to provide a lower effective load resistance for the ROM device.

Figure 3:
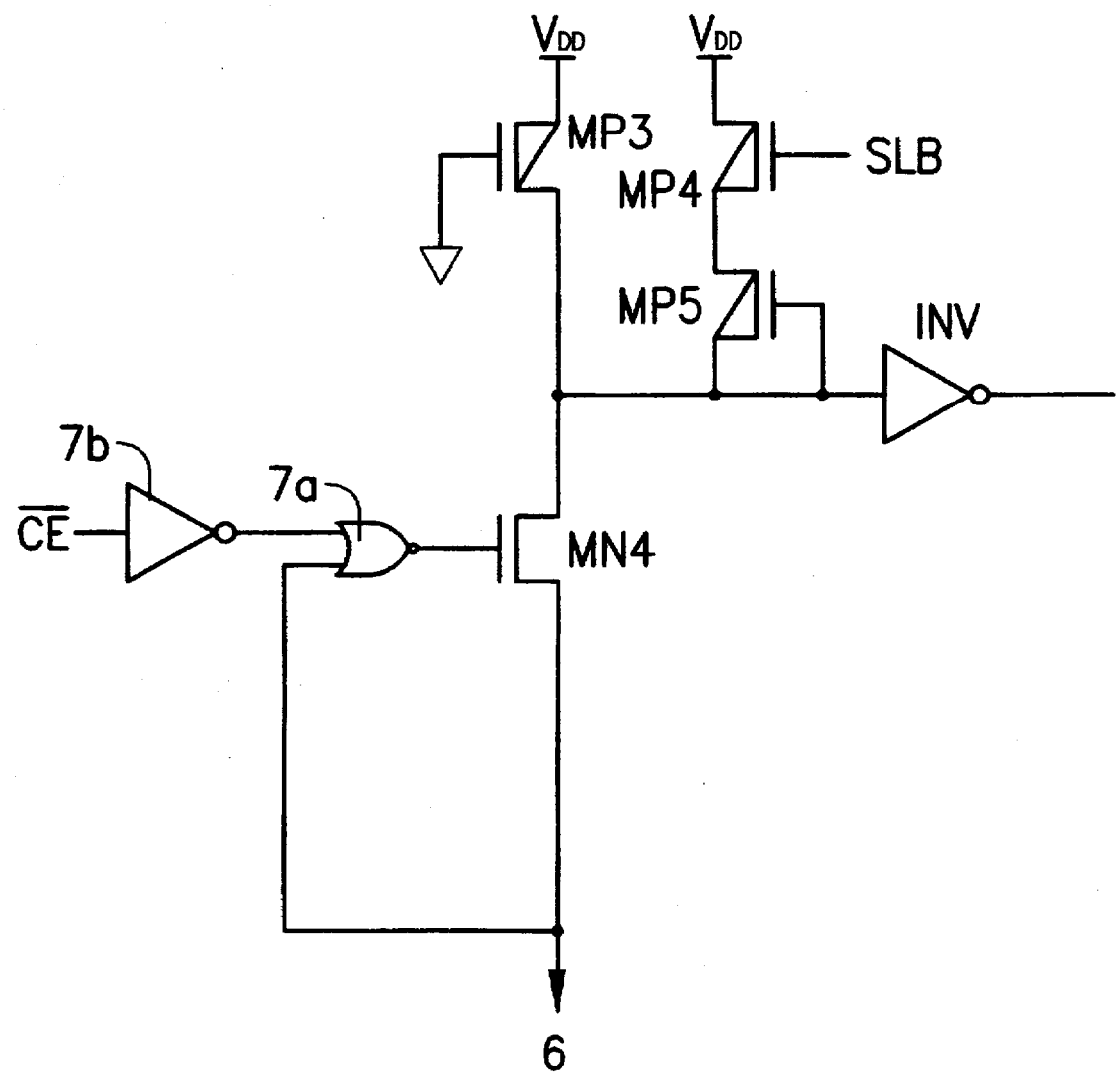
FIG. 3 is a circuit diagram according to the preferred embodiment of the present invention.

FIG. 3 is a schematic diagram of a specific embodiment of the present invention. Voltage level detector 10 is not shown in this figure, but its output SLB is shown as an input to MP4. This embodiment includes an alternative arrangement for controlling switching element MN4. First load element 11 is constituted by a PMOS transistor MP3. The source of PMOS transistor MP3 is connected to voltage source $V_{DD}$ and the gate is grounded. Therefore, the transistor is active. Second load element 12 is constituted by two connected PMOS transistors MP4 and MP5. The source of first PMOS transistor MP4 is connected to voltage source $V_{DD}$, the gate of first PMOS transistor MP4 is controlled by voltage level detector 10, the drain of first PMOS transistor MP4 is connected to the source of second PMOS transistor MP5, and the gate and drain of second PMOS transistor MP5 are connected to switching element MN4. Switching element MN4 is controlled by a NOR gate 7a and an inverter 7b. NOR gate 7a has one input coupled to memory cells 6 (shown only by reference numeral) and a second input coupled to an output of an inverter 7b. The output of NOR gate 7a is coupled to the gate of switching element MN4. Inclusion of inverter 7b allows the circuit to be controlled by an external signal CE.

Voltage level detector 10 (not shown in FIG. 3) generates a control signal SLB which is a high level signal when the voltage level of voltage source $V_{DD}$ is higher than the predetermined value. Therefore, as described above, since the gate of first PMOS transistor MP4 is controlled by voltage level detector 10, when control signal SLB from voltage level detector 10 is high, that is, when the voltage level of the voltage source is higher than the predetermined level, first PMOS transistor MP4 will be turned off, and second load element 12 is disabled. Thus, a high effective load resistance is provided for the ROM device. Alternatively, when the voltage level of voltage source $V_{DD}$ is lower than the predetermined value, control signal SLB will be low to turn on first PMOS transistor MP4, and a lower effective load resistance constituted by first load element 11 and second load element 12 is provided for the ROM device.

Figure 4:
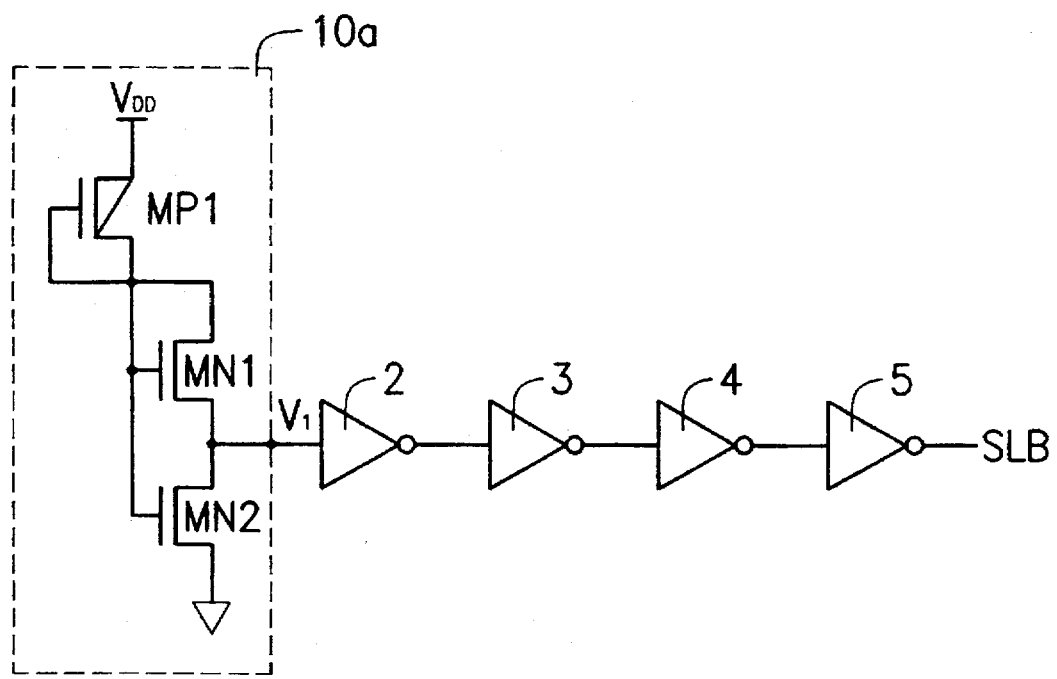
FIGS. 4, 5, and 6 are circuit diagrams showing structures of a voltage level detector of the present invention.

FIG. 4 shows a first embodiment of voltage level detector 10. A tri-terminal pull-up element, consisting of transistors MP1 and MN1 connects voltage source $V_{DD}$ with a first terminal. A pull-down element MN2 connects second and a third terminals of the pull-up element and is grounded at its other side. At least one amplifier 2 has an input connected the pull-up element so as to output a detect signal SLB. The tri-terminal pull-up element connects to voltage source $V_{DD}$ with the source of PMOS transistor MP1, that is, the source of PMOS transistor MP1 is provided for the first terminal. The second terminal of the tri-terminal pull-up element is provided by connecting the gate and drain of PMOS transistor and the gate and drain of NMOS transistor MN1 together. The third terminal is provided by the source of NMOS transistor MN1. Since the two transistors MP1 and MN1 of the pull-up element are active, the voltage level at the third terminal can be obtained by subtracting the voltage level of $V_{DD}$ by a constant value which depends on the threshold voltages of transistors MP1 and MN1. For example, if the threshold voltages of MP1 and MN1 are $V_{TP}$ and $V_{TN}$ respectively, the voltage level V1 at the third terminal will be:

$$V1 = V_{DD} - V_{TN} - |V_{TP}|$$

Therefore, the high/low state of control signal SLB can be adjusted by the switching level of amplifier 2. In addition to amplifier 2, optional amplifiers 3, 4, & 5 can be provided. The predetermined value which decides the detecting results of voltage level detector 10 can be set up when designing the channel dimensions of the transistors in amplifiers 2 through 5. For example, if the switching level of amplifier 2 is 5 Volts, control signal SLB will be high when voltage level V1 at the third terminal is higher than 5 Volts. The physical dimensions of the circuit elements in FIG. 4 are shown as Table 1.

TABLE 1

| Transistor | width/length ratio |
| --- | --- |
| MP3 | 2/5 |
| MP4 | 4/1 |
| MP5 | 2/15 |
| PMOS of inverter INV | 40/1.8 |
| NMOS of inverter INV | 3/2 |

The dimensions shown in Table 1 are provided for reference, they are not to restrict the scope of the present invention. For example, the pull-up element and the pull-down element of voltage level detector 10, as is in box 10a of FIG. 4, can be replaced by alternative arrangements such as circuits 10b (FIG. 5) and 10c (FIG. 6) which perform essentially the same function.

Figure 5:
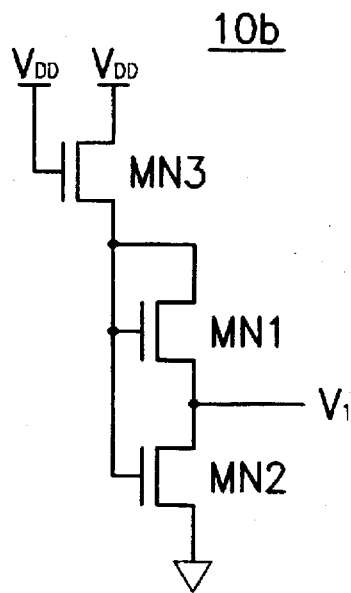

In the FIG. 5 arrangement which is a schematic diagram of voltage level detector 10b, the pull-up element comprises two NMOS transistors MN3 and MN1. Because the two NMOS transistors have their gates connected to their respective drains, they are both active. Therefore, voltage level V1 at the third terminal will be $$V1 = V_{DD} - V_{TN} - V_{TN}$$

if their threshold voltages are the same.

Figure 6:
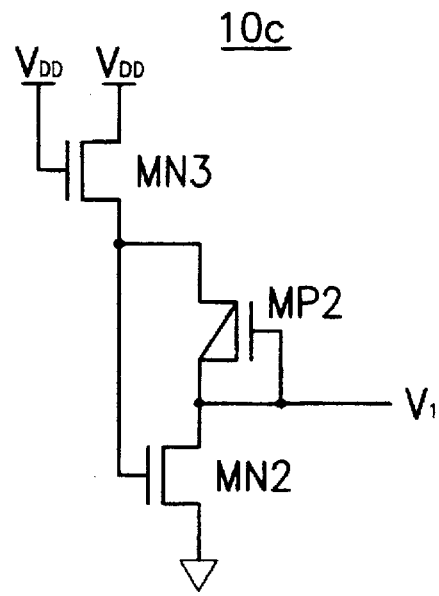

Similarly, the arrangement of voltage detector 10c shown schematically in FIG. 6 includes two active transistors MN3 and MP2 as the pull-up element, and the voltage drop at the third terminal with respect to voltage source $V_{DD}$ is also a constant.

As persons skilled in this art may well appreciate, the above description of the preferred embodiment of the present invention is employed for the purposes of description, not to restrict the scope of the present invention. Modifications to the outlined embodiment of the present invention may be apparent and should be considered to be within the scope of the present invention that is recited in the claims that follow. For example, the data sensing apparatus could be used to detect the status of a signal from other than a ROM.

What is claimed is:

1. A data sensing apparatus for sensing the status of a signal source, comprising:

a first load element having a first end connected to a voltage source;

a second load element having a first end connected to the voltage source;

a switching element having a first end connected to a second end of the first load element and a second end of the second load element such that the first load element and the second load element are connected in parallel, the switching element providing a path for a sensing current of the signal device;

means, responsive to the signal source, for controlling the switching element;

an amplifier, having an input connected to the switching element, for providing an amplified indication of the sensing current of the signal source; and a voltage level detector for detecting the voltage level of the voltage source, the voltage level detector disabling the second load element when the voltage level of the voltage source is higher than a predetermined value.

2. The data sensing apparatus of claim 1, wherein the controlling means comprises an inverter having an input connected to the signal source.

3. The data sensing apparatus of claim 1, wherein the controlling means comprises:

an inverter having an input adapted to receive an external control signal and an output; and a NOR gate having a first input coupled to the output of the inverter, a second input coupled to receive the signal source, and an output coupled to an input of the switching element.

4. The data sensing apparatus of claim 1, wherein the first load element comprises a PMOS transistor having a source connected to the voltage source, a grounded gate, and a drain connected to the switching element.

5. The data sensing apparatus of claim 1, wherein the second load element comprises a first PMOS transistor and a second PMOS transistor; the first PMOS transistor having a source connected to the voltage source, a gate controlled by the voltage level detector, and a drain connected to the source of the second PMOS transistor; and the second PMOS transistor having a gate and drain connected to the switching element.

6. The data sensing apparatus of claim 1, wherein the voltage level detector comprises:

a tri-terminal pull-up element connected to the voltage source with a first terminal;

a pull-down element connected between a second and a third terminal of the pull-up element and being grounded; and an amplifier connected to the pull-up element to output a detect result.

7. The data sensing apparatus of claim 6, wherein the tri-terminal pull-up element comprises:

a PMOS transistor, the source of which constitutes the first terminal; and an NMOS transistor with its gate and drain connected together to the gate and drain of the PMOS transistor to constitute the second terminal thereat, and the source of the NMOS transistor which constitutes the third terminal.

8. The data sensing apparatus of claim 6, wherein the tri-terminal pull-up element comprises:

a first NMOS transistor, the source and gate of which constitutes the first terminal; and a second NMOS transistor with its gate and drain connected to the drain of the first NMOS transistor to constitute the second terminal, and the source of the second NMOS transistor which constitutes the third terminal.

9. The data sensing apparatus of claim 6, wherein the tri-terminal pull-up element comprises:

an NMOS transistor, the source and gate of which constitute the first terminal; and a PMOS transistor, the source of which is connected to the drain of the NMOS transistor to constitute the second terminal, and the gate and drain of the PMOS transistor connected together which constitute the third terminal.

10. The data sensing apparatus of claim 6, wherein the pull-down element comprises:

an NMOS transistor whose gate connects to the second terminal of the pull-up element, whose drain connects to the third terminal of the pull-up element and whose source is grounded.

11. The data sensing apparatus of claim 1, wherein the signal source comprises:

a ROM device.

12. A data sensing apparatus for sensing the status of a signal source, comprising:

a first load element having a first end connected to a voltage source;

a second load element having a first end connected to the voltage source;

a switching element having a first end connected to a second end of the first load element and a second end of the second load element such that the first load element and the second load element are connected in parallel, the switching element providing a path for a sensing current of the signal device;

a switch controller having an output connected to an input of the switching element and an input connected to the signal source, said switch controller controlling the switching element in response to the signal source;

an amplifier having an input connected to the switching element and an output that provides an amplified indication of the sensing current of the signal source; and a voltage level detector connected to the voltage source and having an output connected to an input of the second load element, said voltage level detector detecting the voltage level of the voltage source and disabling the second load element when the voltage level of the voltage source is higher than a predetermined value.

13. The data sensing apparatus of claim 12, wherein the switch controller comprises:

an inverter.

14. The data sensing apparatus of claim 12, wherein the switch controller comprises:

an inverter having an input adapted to receive an external control signal and an output; and a NOR gate having a first input coupled to the output of the inverter, a second input coupled to receive the signal source, and an output coupled to an input of the switching element.

15. The data sensing apparatus of claim 12, wherein the first load element comprises:

a PMOS transistor having a source connected to the voltage source, a grounded gate, and a drain connected to the switching element.

16. The data sensing apparatus of claim 12, wherein the second load element comprises:

a first PMOS transistor and a second PMOS transistor;

the first PMOS transistor having a source connected to the voltage source, a gate controlled by the voltage level detector, and a drain connected to the source of the second PMOS transistor; and the second PMOS transistor having a gate and drain connected to the switching element.

17. The data sensing apparatus of claim 12, wherein the voltage level detector comprises:

a tri-terminal pull-up element connected to the voltage source with a first terminal;

a pull-down element connected between a second and a third terminal of the pull-up element and being grounded; and an amplifier connected to the pull-up element to output d detect result.

18. The data sensing apparatus of claim 17, wherein the tri-terminal pull-up element comprises:
- a PMOS transistor, the source of which constitutes the first terminal; and
- an NMOS transistor with its gate and drain connected together to the gate and drain of the PMOS transistor to constitute the second terminal thereat, and the source of the NMOS transistor which constitutes the third terminal.

19. The data sensing apparatus of claim 17, wherein the tri-terminal pull-up element comprises:
- a first NMOS transistor, the source and gate of which constitutes the first terminal; and
- a second NMOS transistor with its gate and drain connected to the drain of the first NMOS transistor to constitute the second terminal, and the source of the second NMOS transistor which constitutes the third terminal.

20. The data sensing apparatus of claim 17, wherein the tri-terminal pull-up element comprises:
- an NMOS transistor, the source and gate of which constitute the first terminal; and
- a PMOS transistor, the source of which is connected to the drain of the NMOS transistor to constitute the second terminal, and the gate and drain of the PMOS transistor connected together which constitute the third terminal.

21. The data sensing apparatus of claim 17, wherein the pull-down element comprises:
- an NMOS transistor whose gate connects to the second terminal of the pull-up element, whose drain connects to the third terminal of the pull-up element and whose source is grounded.

22. The data sensing apparatus of claim 12, wherein the signal source comprises:
- a ROM device.

* * * * *